United States Patent
Sakai et al.

(10) Patent No.: US 9,203,345 B2
(45) Date of Patent: Dec. 1, 2015

(54) POWER SUPPLY CIRCUIT, POWER SUPPLY SYSTEM, AND RADIO COMMUNICATION APPARATUS

(71) Applicant: FUJITSU LIMITED, Kawasaki-shi, Kanagawa (JP)

(72) Inventors: Yasufumi Sakai, Fuchu (JP); Eiji Yoshida, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 8 days.

(21) Appl. No.: 14/192,675

(22) Filed: Feb. 27, 2014

(65) Prior Publication Data
US 2014/0315504 A1   Oct. 23, 2014

(30) Foreign Application Priority Data
Apr. 17, 2013   (JP) .................. 2013-086431

(51) Int. Cl.
| | | |
|---|---|---|
| H01Q 11/12 | (2006.01) | |
| H04B 1/04 | (2006.01) | |
| H03F 1/02 | (2006.01) | |
| H03F 3/189 | (2006.01) | |
| H02M 3/156 | (2006.01) | |
| H02M 1/00 | (2007.01) | |
| H04B 1/16 | (2006.01) | |

(52) U.S. Cl.
CPC .................. *H03F 1/02* (2013.01); *H02M 3/156* (2013.01); *H03F 3/189* (2013.01); *H02M 2001/0032* (2013.01); *H02M 2001/0045* (2013.01); *H02M 2001/0093* (2013.01); *H03F 2200/432* (2013.01); *H04B 1/1607* (2013.01); *Y02B 70/16* (2013.01)

(58) Field of Classification Search
CPC ............. H03F 1/02; H03F 3/189; H03F 3/24; H02M 3/02; H04B 1/04; H04B 2001/0416; H03G 3/3042; H03G 3/3047

USPC .................... 455/115.1, 126, 127.2; 375/295; 330/127

See application file for complete search history.

(56) References Cited

U.S. PATENT DOCUMENTS

| | | | |
|---|---|---|---|
| 8,947,161 B2* | 2/2015 | Khlat et al. .................. 330/136 |
| 2007/0183530 A1* | 8/2007 | Udagawa et al. ............. 375/297 |

FOREIGN PATENT DOCUMENTS

| | | |
|---|---|---|
| JP | 2008-227598 A | 9/2008 |
| JP | 2009-253809 A | 10/2009 |
| JP | 2010-508577 A | 3/2010 |
| JP | 2012-015708 A | 1/2012 |
| JP | 2012-134705 A | 7/2012 |
| WO | WO 2008/054906 A2 | 5/2008 |

OTHER PUBLICATIONS

Kanbe, et al., "New Architecture of Envelope Tracking Power Amplifier for Base Station," The 21st Workshop on Circuits and Systems in Karuizawa, Apr. 21-22, 2008, pp. 385-390.

* cited by examiner

*Primary Examiner* — Nhan Le
(74) *Attorney, Agent, or Firm* — Arent Fox LLP

(57) ABSTRACT

A power supply circuit includes: a direct current to direct current converter; a linear amplifier; and a first capacitance, one terminal of the first capacitance being coupled an output of the linear amplifier, another terminal of the first capacitance being coupled to an output terminal, wherein the linear amplifier configured to operate in a variable voltage mode and the linear amplifier configured to stop operating and couples an output of the linear amplifier to a ground in a fixed voltage mode.

20 Claims, 15 Drawing Sheets

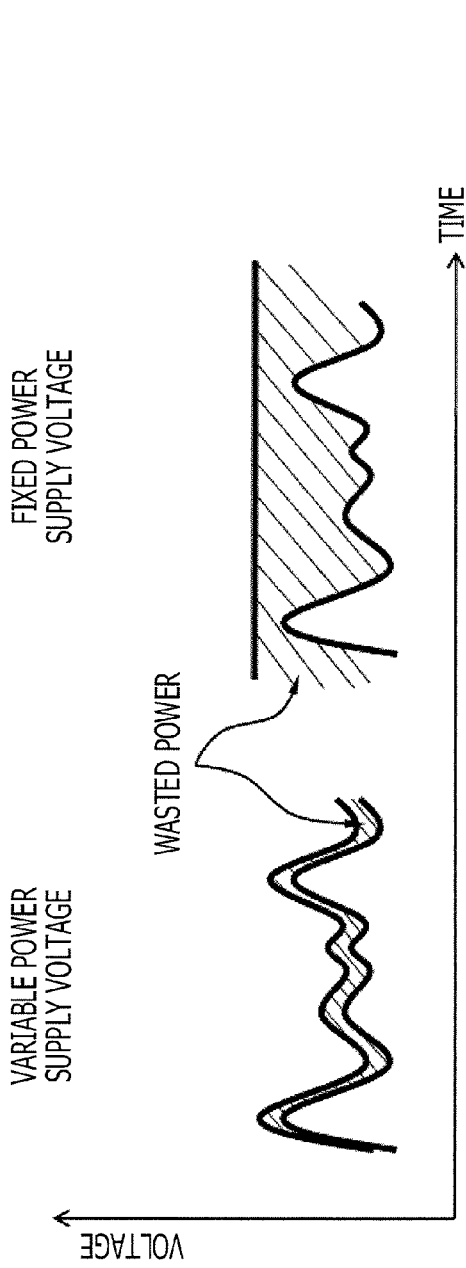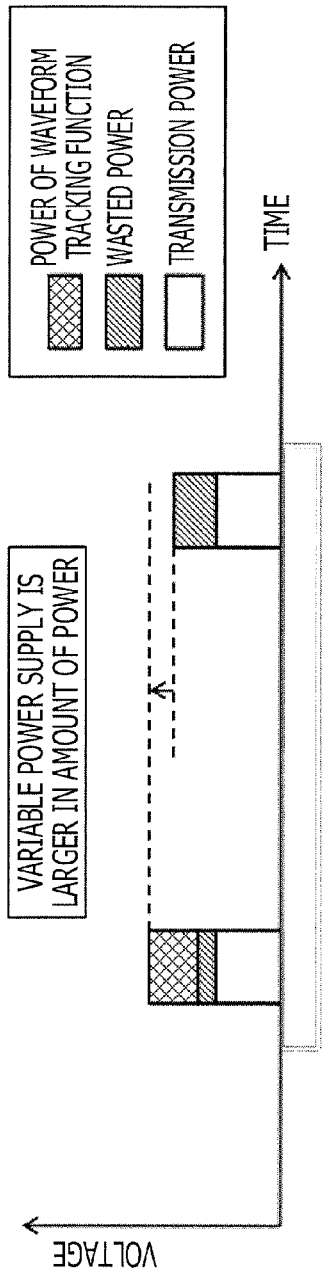
FIG. 3A
FIG. 3B

US 9,203,345 B2

POWER SUPPLY CIRCUIT, POWER SUPPLY SYSTEM, AND RADIO COMMUNICATION APPARATUS

CROSS-REFERENCE TO RELATED APPLICATION

This application is based upon and claims the benefit of priority of the prior Japanese Patent Application No. 2013-086431, filed on Apr. 17, 2013, the entire contents of which are incorporated herein by reference.

FIELD

The embodiments discussed herein are related to a power supply circuit, a power supply system, and a radio communication apparatus.

BACKGROUND

A reduction of their power consumption is demanded to increase the operating time of electronic devices. For example, a reduction of power consumption of a power amplifier is demanded, which is included in a transmitting unit of radio equipment and configured to amplify transmission signals.

Related techniques are disclosed by Japanese National Publication of International Patent Application No. 2010-508577, Japanese Laid-open Patent Publication Nos. 2012-134705, 2008-227598, 2009-253809, and 2012-015708, and Kanbe et al., "New Architecture of Envelope Tracking Power Amplifier for Base Station", The 21st Workshop on Circuits and Systems in Karuizawa, Apr. 21-22, 2008 (non-patent document).

SUMMARY

According to one aspect of the embodiments, a power supply circuit includes: a direct current to direct current converter; a linear amplifier; and a first capacitance, one terminal of the first capacitance being coupled an output of the linear amplifier, another terminal of the first capacitance being coupled to an output terminal, wherein the linear amplifier configured to operate in a variable voltage mode and the linear amplifier configured to stop operating and couples an output of the linear amplifier to a ground in a fixed voltage mode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A and FIG. 3B illustrate an example of power supply efficiency achieved when output power of a power amplifier is small;

DESCRIPTION OF EMBODIMENTS

Envelope tracking (ET) or envelope elimination and restoration (EER) may be adopted to reduce power consumption of a power amplifier. With the envelope tracking technique, which involves supplying a variable power supply voltage that follows the envelope of an output signal, the power consumption of the power amplifier may be lower than that in the case where a fixed voltage is supplied.

In an envelope tracking power supply circuit or EER, when the output power of the power amplifier is small, the amount of power consumption based on the operation of a linear amplifier forms a higher proportion than in the case where a fixed voltage is supplied from a high-efficiency power supply circuit. Therefore, when the output power of the power amplifier is small, the efficiency of the envelope tracking power supply circuit or EER may be lowered.

When the output power of the power amplifier is small, if the overall power consumption in the case of supplying a fixed voltage is smaller than that in the case of supplying a variable voltage, the power supply circuit may supply a fixed voltage from a fixed power supply to the power amplifier. Since a series circuit formed by a capacitance and a switch is coupled to an output of the power supply circuit, the size of this power supply circuit size may be large.

Figure 1A:
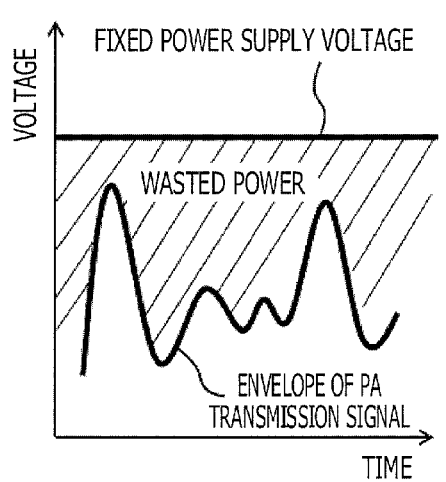
FIG. 1A, FIG. 1B, and FIG. 1C illustrate an example of an envelope tracking technique.
Figure 1B:
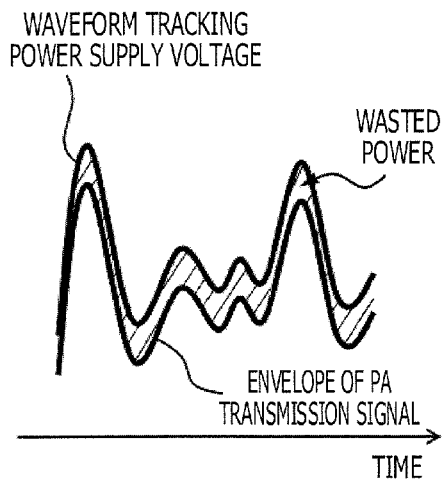
Figure 1C:
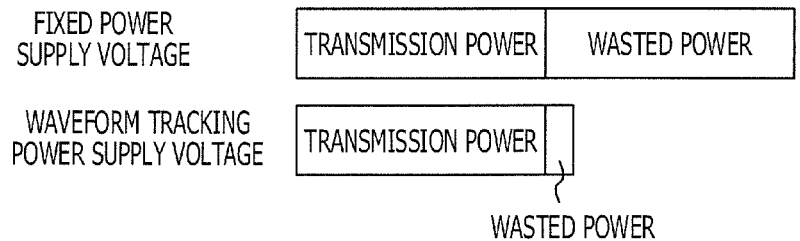

FIG. 1A, FIG. 1B, and FIG. 1C illustrate an example of an envelope tracking technique.

FIG. 1A illustrates how, in the state where a voltage envelope of a transmission signal output from a power amplifier (PA) corresponding to an amplifier varies, a voltage changes when a fixed power supply voltage is supplied. To enable the PA to operate, the fixed power supply voltage may be set to a level higher than a maximum voltage of the transmission signal output from the PA. For example, a difference (indicated by oblique lines) between the fixed power supply voltage and the voltage envelope of the transmission signal from the PA may correspond to wasted power.

In FIG. 1B, a voltage slightly higher than the voltage envelope of the transmission signal of the PA is supplied. For example, an envelope tracking power supply supplies, from the power supply circuit to the power amplifier, a waveform tracking power supply voltage in accordance with the envelope of the output signal of the power amplifier. The envelope of the output signal of the power amplifier may be determined, for example, by detecting changes in a signal to be input to the power amplifier before the signal is input to the power amplifier, or by detecting the output voltage of the power amplifier. For example, a difference (indicated by oblique lines) between the waveform tracking power supply voltage and the voltage envelope of the transmission signal from the PA may correspond to wasted power. With the envelope tracking technique, which involves supplying a variable power supply voltage that follows the envelope of an output signal, the power consumption of the PA may be lower than that in the case where a fixed voltage is supplied.

FIG. 1C illustrates power consumption of the PA in the cases of supplying a fixed power supply voltage and a waveform tracking power supply voltage. Supplying a waveform tracking power supply voltage reduces wasted power, and thus reduces the power consumption of the PA.

Figure 2A:
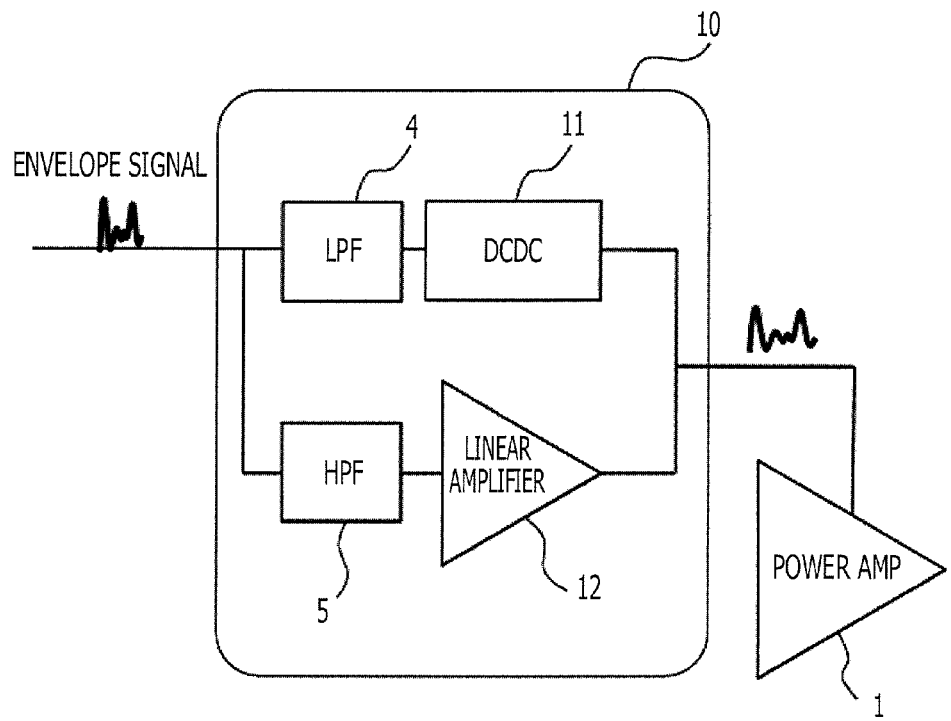
FIG. 2A and FIG. 2B illustrate an example of power consumption of an envelope tracking power supply.
Figure 2B:
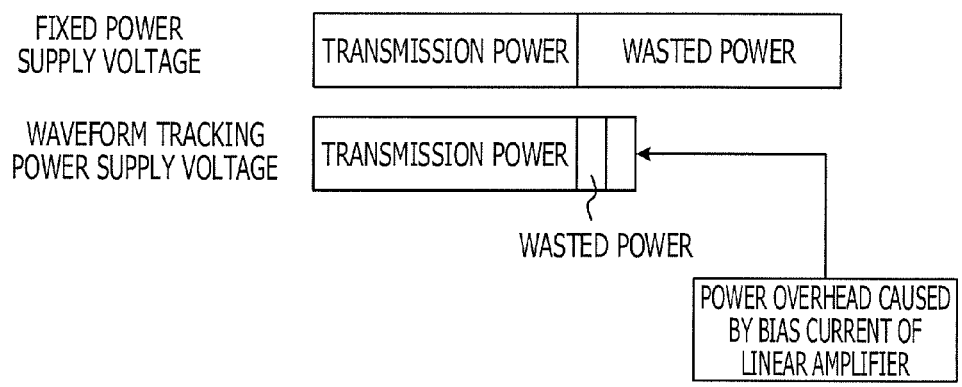

FIG. 2A and FIG. 2B illustrate an example of power consumption of a envelope tracking power supply. As illustrated in FIG. 2A, an envelope tracking power supply circuit 10 used for envelope tracking or EER includes, for example, a switching power supply (direct current to direct current (DCDC) power supply) 11 and a linear amplifier 12. To input direct current (DC) components and low-frequency components of an envelope signal to the DCDC power supply 11, the DCDC power supply 11 may be provided with a low-pass filter (LPF) 4 at an input portion thereof. To input high-frequency components of the envelope signal to the linear amplifier 12, the linear amplifier 12 may be provided with a high-pass filter (HPF) 5 at an input portion thereof. The output of the DCDC power supply 11 and the output of the linear amplifier 12 are combined and supplied as a power supply for a power amplifier 1.

In the envelope tracking power supply circuit 10, the high-efficiency but low-speed DCDC power supply 11 supplies power of DC components and low-frequency components, whereas the low-efficiency but high-speed linear amplifier 12 supplies power of high-frequency components. Thus, the envelope tracking power supply circuit 10 outputs a variable voltage that follows an envelope.

As illustrated in FIG. 2B, the operation of the linear amplifier 12 increases the power consumption of the envelope tracking power supply circuit 10. However, if the amount of power consumption is reduced significantly when the power supply voltage follows the envelope of an output signal in a wavelike manner, it may be possible to achieve lower power consumption.

When the output power of the power amplifier is small, the efficiency of the envelope tracking power supply circuit or the EER power supply circuit may be lowered. This is because when the output power of the power amplifier is small, the amount of power consumption based on the operation of the linear amplifier forms a higher proportion than in the case where a fixed voltage is supplied from a high-efficiency power supply circuit, and this results in a larger amount of power consumption.

FIG. 3A and FIG. 3B illustrate an example of power supply efficiency when an output power of a power amplifier is small. FIG. 3A illustrates the case where the operation of the linear amplifier causes the power supply to follow the envelope voltage, and the case where the power supply voltage is fixed at a low level. For example, following the power supply voltage as illustrated in FIG. 3B reduces wasted power, but uses power to operate the function of following the power supply voltage. Therefore, the total amount of power may be larger than the amount of power wasted in the case of supplying a fixed power supply voltage.

When the output power of the power amplifier is small and the overall power consumption in the case of supplying a fixed voltage is smaller than that in the case of supplying a variable voltage, a fixed voltage may be supplied from the fixed power supply to the power amplifier. The output power of the power amplifier in the case of switching the output of the power supply circuit from a variable voltage to a fixed voltage may be threshold power.

Figure 4:
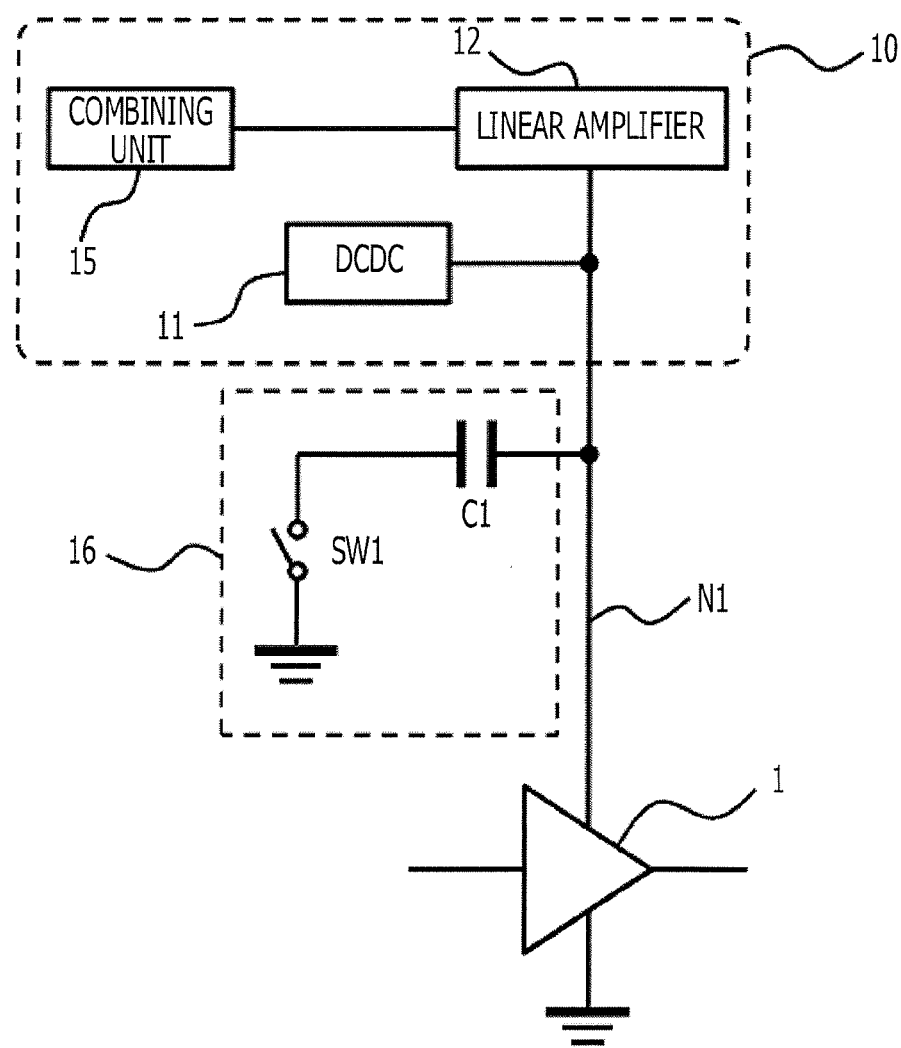
FIG. 4 illustrates an example of a power supply circuit.

FIG. 4 illustrates an example of a power supply circuit. The power supply circuit illustrated in FIG. 4 switches the output of the envelope tracking power supply circuit 10 between a variable voltage and a fixed voltage in accordance with the value of output power of the power amplifier 1. The power supply circuit illustrated in FIG. 4 has an active short (AS) unit 16 that includes an output capacitance C1 and a switch SW1 coupled in series between the output of the envelope tracking power supply circuit 10 and GND.

In the power supply circuit illustrated in FIG. 4, if the output power of the power amplifier 1 is larger than the threshold power, the switch SW1 coupled to the output capacitance C1 is turned off and the high-speed but low-efficiency linear amplifier 12 and the low-speed but high-efficiency DCDC power supply 11 operate. By turning the switch SW1 off, the impedance of the output capacitance C1 becomes invisible from the output of the envelope tracking power supply circuit 10, and a variable voltage is output.

If the output power of the power amplifier 1 is smaller than the threshold power, the switch SW1 is turned on and the high-efficiency DCDC power supply 11 operates. Since the output capacitance C1 smooths out the low-speed power supply output, a fixed voltage is output.

The circuit size of the power supply circuit illustrated in FIG. 4 may be large, because a series circuit of the capacitance and the switch is coupled to the output of the power supply circuit.

Figure 5:
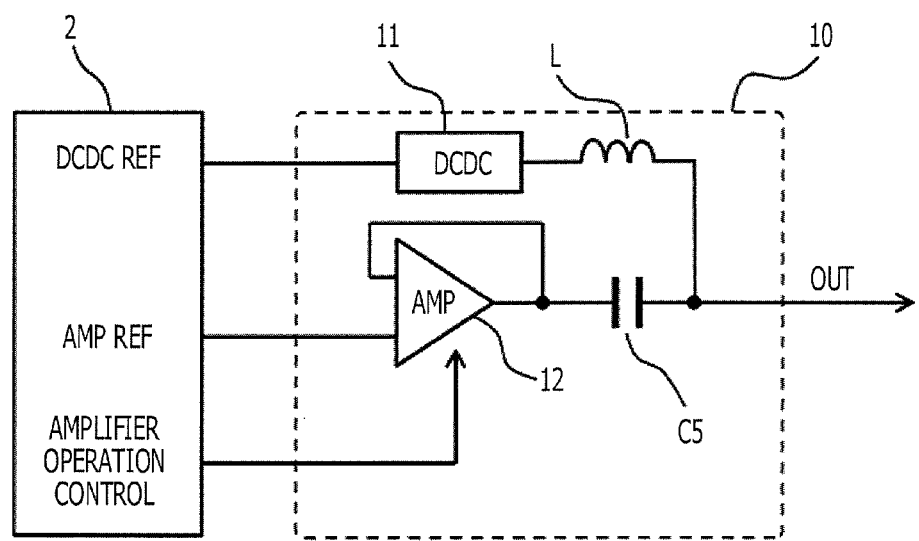
FIG. 5 illustrates an example of a power supply device.

FIG. 5 illustrates an example of a power supply device. The power supply device illustrated in FIG. 5 includes the envelope tracking power supply circuit 10 and a power supply circuit control circuit 2 that controls the envelope tracking power supply circuit 10.

The envelope tracking power supply circuit 10 includes the linear amplifier (Amp) 12, an inductor L, and a capacitance C5. The inductor L is coupled between the output of the DCDC power supply 11 and an output terminal OUT of the envelope tracking power supply circuit 10. The capacitance C5 is coupled between the Amp 12 and the output terminal OUT.

The power supply circuit control circuit 2 outputs a signal DCDCref containing DC components and low-frequency components to the DCDC power supply 11, and outputs a signal Ampref containing high-frequency components and an amplifier operation control signal to the Amp 12. The DCDC power supply 11 performs DCDC conversion in accordance with the signal DCDCref, and outputs a voltage signal having the converted level through the inductor L to the output terminal OUT.

In accordance with the amplifier operation control signal, the Amp 12 changes the operation mode between a variable voltage mode and a fixed voltage mode. In the variable voltage mode, the Amp 12 performs an amplifying operation in accordance with the signal Ampref and outputs the resulting signal to the capacitance C5. In the fixed voltage mode, the Amp 12 stops the amplifying operation and couples the output thereof to a ground, for example, to GND. In this state, one terminal of the capacitance C5 is coupled to GND.

As an amplifier operation control signal, the power supply circuit control circuit 2 normally outputs a signal indicating the variable voltage mode. To perform envelope tracking control, the power supply circuit control circuit 2 generates, in the variable voltage mode, the signal DCDCref and the signal Ampref in accordance with the value of output power of the power amplifier, and outputs the generated signals.

If the value of output power of the power amplifier falls below a threshold power value, the power supply circuit control circuit 2 switches to the fixed voltage mode and outputs a signal indicating the fixed voltage mode as an amplifier operation control signal. As the signal DCDCref, the power supply circuit control circuit 2 outputs a signal that causes the DCDC power supply 11 to output a fixed voltage. The Amp 12 stops operating in response to the indication of the fixed voltage mode. Here, as the signal Ampref, the Amp 12 may output a signal indicating a GND level.

When the Amp 12 stops operating, the output of the Amp 12 is fixed at GND. Since the capacitance C5 smooths out the output current of the DCDC power supply 11, a fixed voltage is output to the output terminal OUT of the envelope tracking power supply circuit 10.

Figure 6:
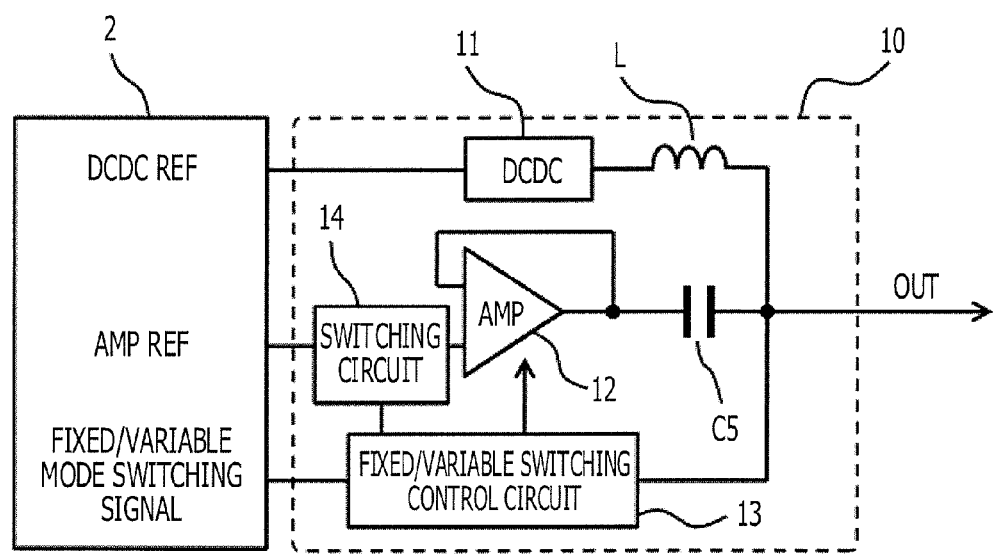
FIG. 6 illustrates an example of power supply device.

FIG. 6 illustrates an example of a power supply device. To accurately control the changing of the operation mode between the variable voltage mode and the fixed voltage mode, the envelope tracking power supply circuit 10 in the power supply device illustrated in FIG. 6 includes a fixed/variable switching control circuit 13 and a switching circuit 14. The other components of the power supply device illustrated in FIG. 6 may be substantially the same as, or similar to, those of the power supply device illustrated in FIG. 5 and their description may be omitted or reduced.

The switching circuit 14 may be provided at the input portion of the linear amplifier (Amp) 12 that receives the signal Ampref output from the power supply circuit control circuit 2. The fixed/variable switching control circuit 13 controls the switching circuit 14 and the Amp 12 based on an amplifier operation control signal (fixed/variable mode switching signal) output from the power supply circuit control circuit 2 and a signal from the output terminal OUT of the envelope tracking power supply circuit 10.

Figure 7:
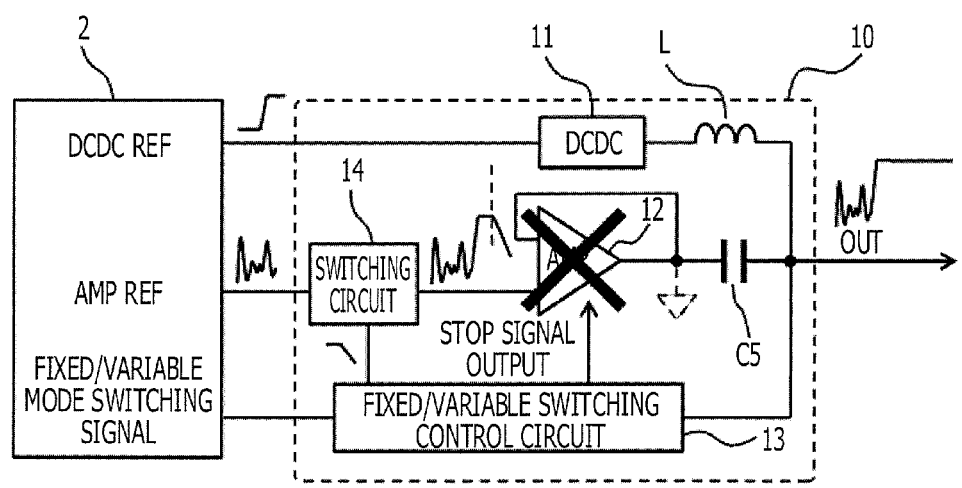
FIG. 7 illustrates an example of a switching operation from a variable voltage mode to a fixed voltage mode.

FIG. 7 illustrates an example of a switching operation from a variable voltage mode to a fixed voltage mode. FIG. 8A to 8D illustrate an example of a signal when switching from a variable voltage mode to a fixed voltage mode.

Figure 8A:
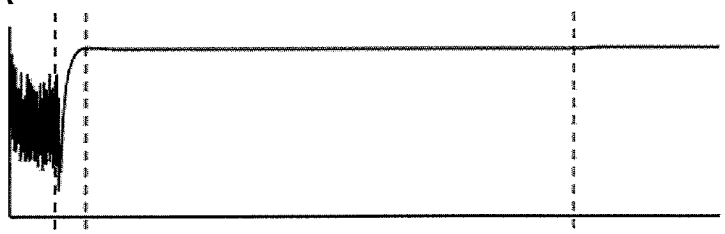
FIG. 8A to 8D illustrate an example of a signal when switching from a variable voltage mode to a fixed voltage mode.
Figure 8B:
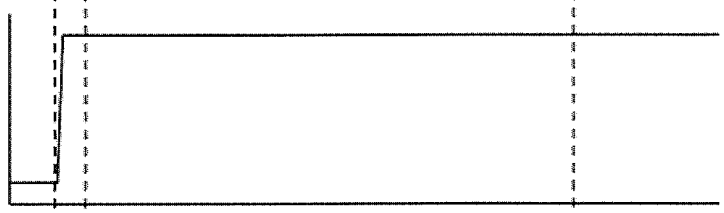
Figure 8C:
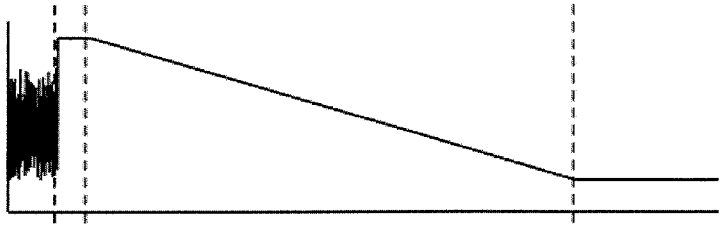
Figure 8D:
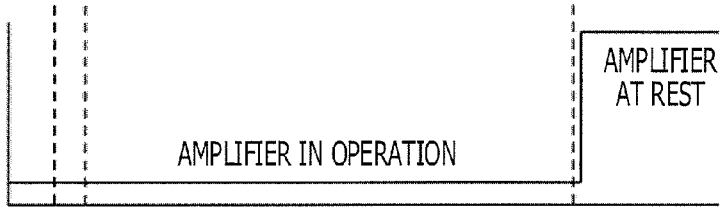

FIG. 8A illustrates a voltage at the output terminal OUT of the envelope tracking power supply circuit 10, FIG. 8B illustrates the signal DCDCref, FIG. 8C illustrates an output voltage of the linear amplifier (Amp) 12, and FIG. 8D illustrates a signal for controlling the operating state of the Amp 12.

When the value of output power of the power amplifier falls below a threshold power value, the power supply circuit control circuit 2 switches from the variable voltage mode to the fixed voltage mode and outputs, as a fixed/variable mode switching signal, a signal indicating the fixed voltage mode. As illustrated in FIG. 7 and FIG. 8B, the power supply circuit control circuit 2 raises the signal DCDCref to a certain value. In response to this, the output voltage of the DCDC power supply 11 increases and the output voltage of the envelope tracking power supply circuit 10 increases as illustrated in FIG. 8A.

When the fixed/variable mode switching signal switches to the fixed voltage mode, the fixed/variable switching control circuit 13 changes the control signal of the switching circuit 14. In response to this, the switching circuit 14 switches the signal to be input to the Amp 12 from the signal Ampref to the signal output from the fixed/variable switching control circuit 13. For example, since the fixed/variable switching control circuit 13 outputs a signal of increasing value to the switching circuit 14, a signal to be input to the Amp 12 increases, and this further increases the voltage value at the output terminal OUT of the envelope tracking power supply circuit 10. When detecting that the output voltage value has increased to a first value, the fixed/variable switching control circuit 13 gradually lowers the signal output to the switching circuit 14. The signal to be input to the Amp 12 increases and then gradually decreases. Therefore, after the output voltage value of the envelope tracking power supply circuit 10 reaches the first value, the output voltage of the Amp 12 gradually decreases as illustrated in FIG. 8C. When the output voltage of the Amp 12 reaches a lower limit of the output voltage range, the fixed/variable switching control circuit 13 sends an operation stop signal to the Amp 12 to stop the operation of the Amp 12, as illustrated in FIG. 8D. When the Amp 12 stops operating, the output of the Amp 12 is fixed at GND. Therefore, the capacitance C5 that combines the output of the Amp 12 with the output of the DCDC power supply 11 smooths out the output current of the DCDC power supply 11. Thus, a fixed voltage is output to the output terminal OUT of the envelope tracking power supply circuit 10.

Figure 9:
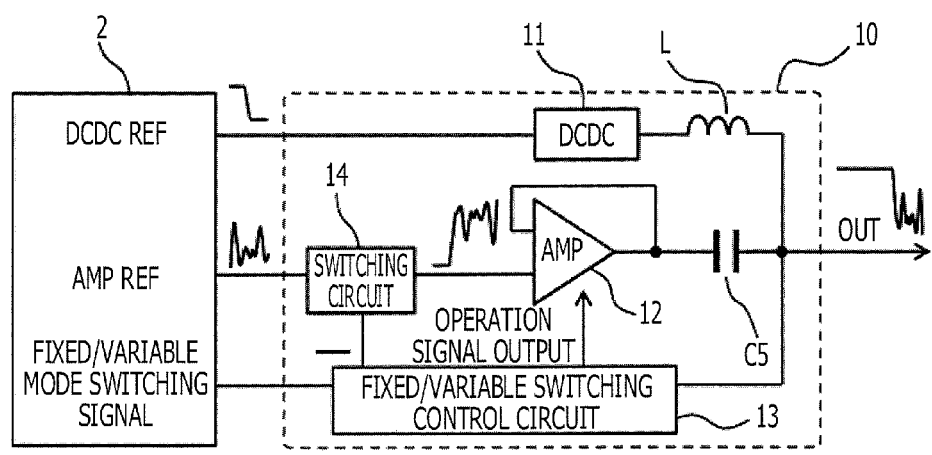
FIG. 9 illustrates an example of a switching operation from a fixed voltage mode to a variable voltage mode.

FIG. 9 illustrates an example of a switching operation from a fixed voltage mode to a variable voltage mode. FIG. 10A to 10D illustrate an example of a signal when switching from a fixed voltage mode to a variable voltage mode.

Figure 10A:
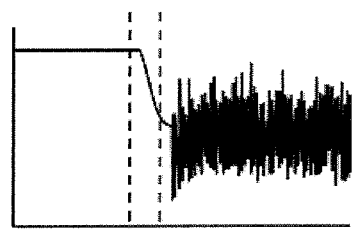
FIG. 10A to 10D illustrate an example of a signal when switching from a fixed voltage mode to a variable voltage mode.
Figure 10B:
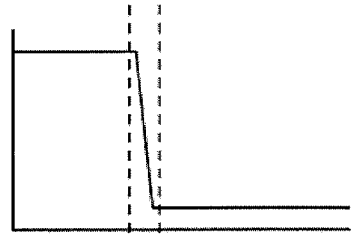
Figure 10C:
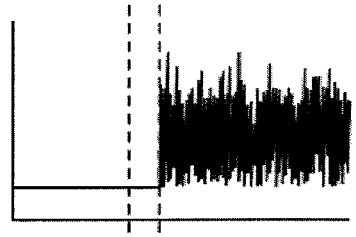
Figure 10D:
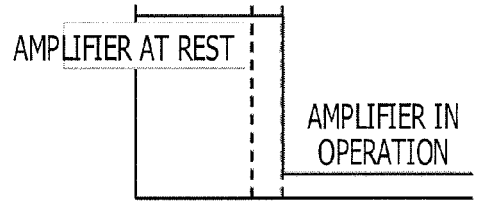

FIG. 10A to 10D illustrate a signal in each part in the case of switching from the fixed voltage mode to the variable voltage mode. FIG. 10A illustrates a voltage at the output terminal OUT of the envelope tracking power supply circuit 10, FIG. 10B illustrates the signal DCDCref, FIG. 10C illustrates an output voltage of the linear amplifier (Amp) 12, and FIG. 10D illustrates a signal for controlling the operating state of the Amp 12.

When the value of output power of the power amplifier exceeds a threshold power value, the power supply circuit control circuit 2 switches from the fixed voltage mode to the variable voltage mode and outputs a signal indicating the variable voltage mode as a fixed/variable mode switching signal. As illustrated in FIG. 9 and FIG. 10B, the power supply circuit control circuit 2 lowers the signal DCDCref. In response to this, the output voltage of the DCDC power supply 11 falls and the output voltage of the envelope tracking power supply circuit 10 falls as illustrated in FIG. 10A.

After switching to the variable voltage mode, the fixed/variable switching control circuit 13 detects whether the output voltage value of the envelope tracking power supply circuit 10 has reached a second value. If the output voltage value has reached the second value, the fixed/variable switching control circuit 13 sends an operation signal to the Amp 12, as illustrated in FIG. 10D, to put the Amp 12 into operation. The second value may be smaller than the first value. The fixed/variable switching control circuit 13 switches the control signal of the switching circuit 14, so that the signal Ampref, which is an envelope signal, is supplied to the Amp 12. In response to this, as illustrated in FIG. 10C, an envelope signal is output from the Amp 12. As a result, the envelope tracking power supply circuit 10 outputs a variable voltage.

Figure 11:
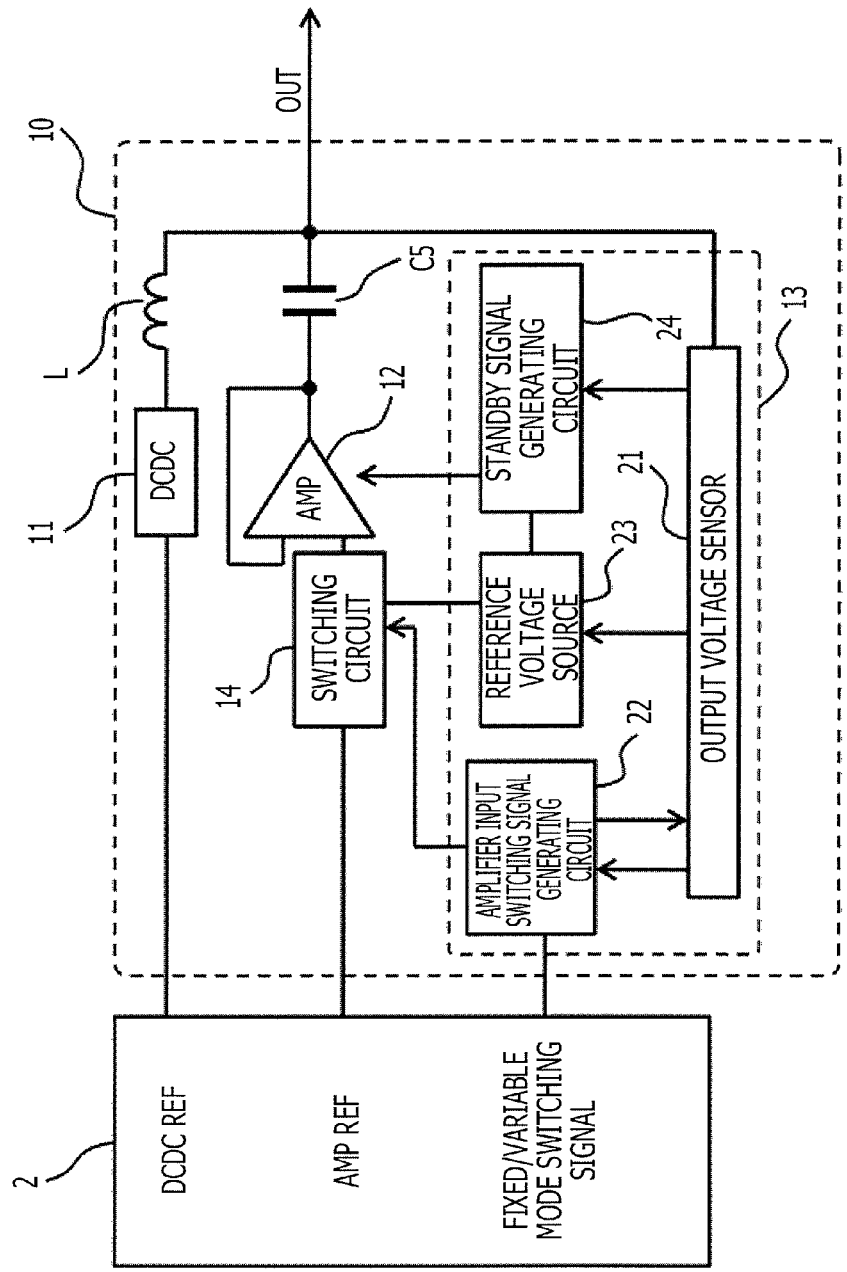
FIG. 11 illustrates an example of a fixed/variable switching control circuit.
Figure 12:
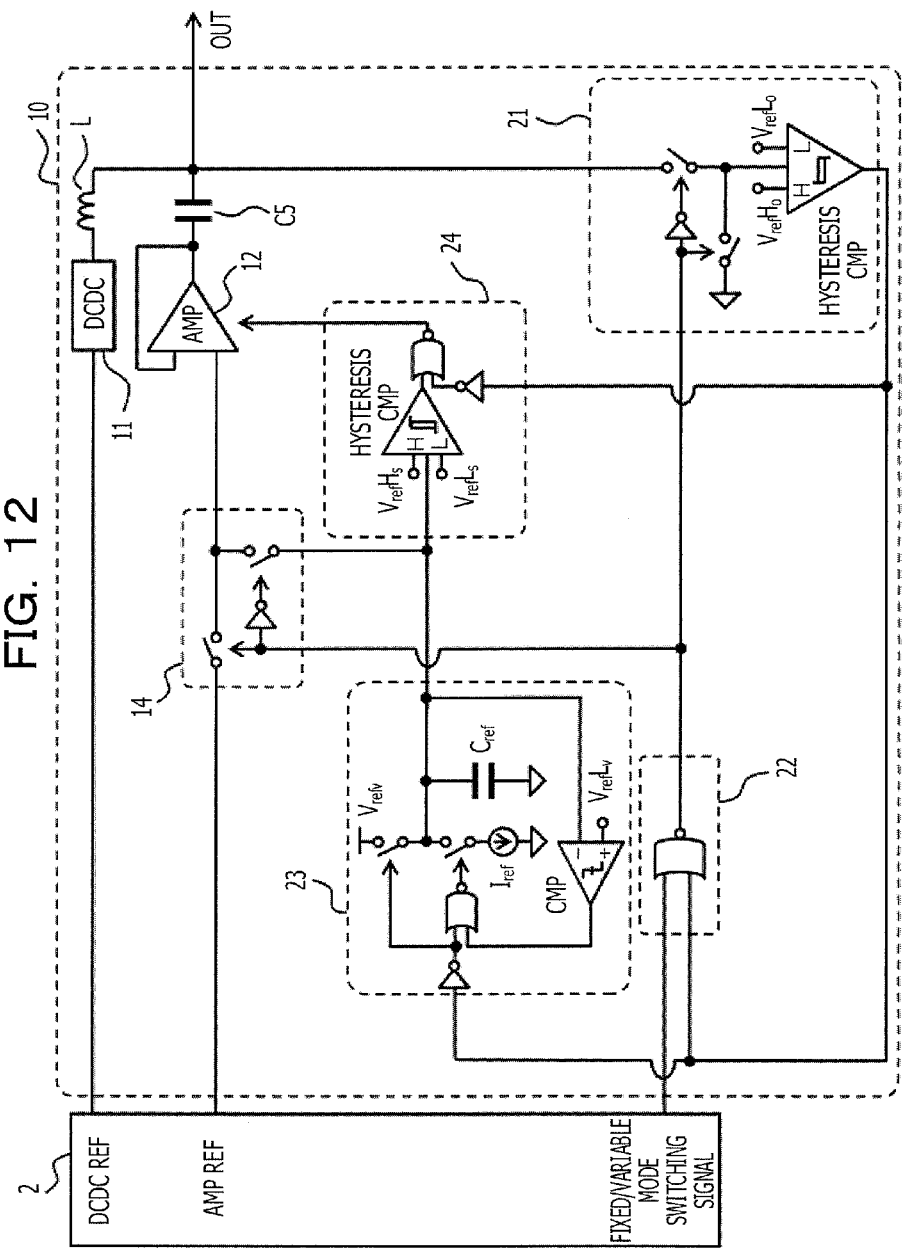
FIG. 12 illustrates an example of a power supply circuit.

FIG. 11 illustrates an example of a fixed/variable switching control circuit. The fixed/variable switching control circuit illustrated in FIG. 11 may be the fixed/variable switching control circuit 13 in the power supply device illustrated in FIG. 6. FIG. 12 illustrates an example of a power supply circuit. The power supply circuit illustrated in FIG. 12 may be the envelope tracking power supply circuit 10 illustrated in FIG. 6.

As illustrated in FIG. 11, the fixed/variable switching control circuit 13 includes an output voltage sensor 21, an amplifier input switching signal generating circuit 22, a reference voltage source 23, and a standby signal generating circuit 24.

The output voltage sensor 21 detects whether the voltage value at the output terminal OUT of the envelope tracking power supply circuit 10 has increased to a first value or has decreased to a second value. As illustrated in FIG. 12, the output voltage sensor 21 includes a hysteresis comparator, two switches, and one inverter. The hysteresis comparator may be a comparator having hysteresis characteristics. When the voltage value of an input signal increases and exceeds $V_{ref}H_o$, the output of the hysteresis comparator changes to a high level H. When the voltage value of the input signal decreases and falls below $V_{ref}L_o$, the output of the hysteresis comparator changes to a low level L. For example, when the output of the hysteresis comparator is at the low level L, if the voltage value of the input signal increases and exceeds $V_{ref}L_o$ but does not exceed $V_{ref}H_o$, the low level L is maintained. When the output of the hysteresis comparator is at the high level H, if the voltage value of the input signal decreases and falls below $V_{ref}H_o$ but does not fall below $V_{ref}L_o$, the high level H is maintained.

The amplifier input switching signal generating circuit 22 includes, as illustrated in FIG. 12, a NOR gate to which a fixed/variable mode switching signal and the output of the output voltage sensor 21 are input. The amplifier input switching signal generating circuit 22 outputs an amplifier input switching signal.

The reference voltage source 23 includes, as illustrated in FIG. 12, a capacitance $C_{ref}$, a charge and discharge circuit for the capacitance $C_{ref}$, a comparator for the voltage value of the capacitance $C_{ref}$, and a control unit that controls the charge and discharge circuit in accordance with the output of the comparator and the output of the output voltage sensor 21. The charge and discharge circuit includes a current source and switches. A charge pump circuit includes the charge and discharge circuit and the capacitance $C_{ref}$.

The standby signal generating circuit 24 includes, as illustrated in FIG. 12, a hysteresis comparator, a NOR gate, and an inverter. The switching circuit 14 includes two switches and one inverter. In accordance with an amplifier input switching signal, the switching circuit 14 selects either one of the signal Ampref and the output of the reference voltage source 23.

In the variable voltage mode where the envelope tracking power supply circuit 10 is in a steady state, the fixed/variable mode switching signal may be at the low level L. The input of the output voltage sensor 21 is coupled to GND, and the output of the output voltage sensor 21 is at the low level L. Since the high level H, which is the reverse of the output of the output voltage sensor 21, is input to the NOR gate of the standby signal generating circuit 24, the output of the NOR gate is at the low level L and the Amp 12 is put into operation. The amplifier input switching signal is at the high level H, and the signal Ampref is input to the Amp 12.

Since the high level H, which is the reverse of the output of the output voltage sensor 21, is input to the NOR gate of the reference voltage source 23, the output of the NOR gate is at the low level L. The charge and discharge circuit of the reference voltage source 23 is charged from $V_{ref_v}$ having a high potential, the capacitance $C_{ref}$ is charged to a high level, and the output of the reference voltage source 23 is at the high level H. Therefore, the output of the hysteresis comparator is at the low level L. The output of the reference voltage source 23 (for example, the level of the capacitance $C_{ref}$) is at a high level, and the hysteresis comparator of the standby signal generating circuit 24 outputs the high level H.

In the variable voltage mode, the standby signal generating circuit 24 outputs a signal that puts the Amp 12 into operation, and the switching circuit 14 outputs the signal Ampref to the Amp 12. For example, the envelope tracking power supply circuit 10 is switched from the variable voltage mode to the fixed voltage mode.

When the value of output power of the power amplifier falls below a threshold power value, the power supply circuit control circuit 2 changes the fixed/variable mode switching signal from the low level L to the high level H, and increases the signal DCDCref toward a upper limit value. In response to this, the output voltage of the DCDC power supply 11 increases, and the output voltage of the envelope tracking power supply circuit 10 increases. The upper limit value may be determined, for example, by threshold power and a peak-to-average power ratio (PAPR) of a communication standard.

In the NOR gate of the amplifier input switching signal generating circuit 22, the output of the output voltage sensor 21 is at the low level L and the fixed/variable mode switching signal changes to the high level H. Therefore, the amplifier input switching signal, which is the output of the amplifier input switching signal generating circuit 22, changes from the high level H to the low level L. In response to this, the switching circuit 14 performs switching such that the output of the reference voltage source 23 is input to the Amp 12. Since the output of the reference voltage source 23 is at a high level here, a high-level signal is input to the Amp 12, and the output of the Amp 12 further increases.

In the output voltage sensor 21, the input of the hysteresis comparator switches to the output voltage of the envelope tracking power supply circuit 10. As described above, when the output of the Amp 12 increases and exceeds a first value $V_{ref}H_o$, the output of the hysteresis comparator changes from the low level L to the high level H. When the output of the output voltage sensor 21 changes from the low level L to the high level H, the charge and discharge circuit in the reference voltage source 23 enters a discharged state, the capacitance $C_{ref}$ of the reference voltage source 23 is discharged, and the output of the reference voltage source 23 gradually decreases.

When the output of the reference voltage source 23 decreases and falls below a threshold value $V_{ref}H_s$ of the standby signal generating circuit 24, the output of the hysteresis comparator changes from the high level H to the low level L, and the output of the standby signal generating circuit 24 changes from the low level L to the high level H. In response to this, the Amp 12 enters an operation stopped state. After stopping the operation, the Amp 12 fixes the output at GND. Therefore, the output voltage of the envelope tracking power supply circuit 10 is set to a voltage output from the DCDC power supply 11, such as a value (fixed value) set based on the signal DCDCref.

The envelope tracking power supply circuit 10 is set to be in the fixed voltage mode, and goes into a steady state. In the fixed voltage mode, the fixed/variable mode switching signal may be at the high level H, and the amplifier input switching signal may be at the low level L. The input of the output voltage sensor 21 is coupled to the output of the envelope tracking power supply circuit 10, and the output of the output voltage sensor 21 is at the high level H. The standby signal generating circuit 24 outputs the high level H and the Amp 12 is in an operation stopped state. In the reference voltage source 23, two switches in the charge and discharge circuit are both in an off (released) state, the output of the charge and discharge circuit is at the low level L, and the output of the comparator is at the high level H.

For example, the envelope tracking power supply circuit 10 is switched from the fixed voltage mode to the variable voltage mode. When the value of output power of the power amplifier exceeds a threshold power value, the power supply circuit control circuit 2 changes the fixed/variable mode switching signal from the high level H to the low level L, and lowers the signal DCDCref toward a lower limit value. In response to this, the output voltage of the DCDC power supply 11 decreases, and the output voltage of the envelope tracking power supply circuit 10 decreases. The lower limit value may be determined, for example, by threshold power.

In the output voltage sensor 21, when the input of the hysteresis comparator decreases and falls below a second value $V_{ref}L_o$, the output of the hysteresis comparator changes from the high level H to the low level L. In response to this, in the standby signal generating circuit 24, the input of the NOR gate changes to the high level H, and the output of the NOR gate changes from the high level H to the low level L. Therefore, the Amp 12 changes from an operation stopped state to an operating state. In the amplifier input switching signal generating circuit 22, since the inputs of the NOR gate both become the low level L, the amplifier input switching signal changes from the low level L to the high level H. In response to this, the switching circuit 14 selects the signal Ampref and inputs it to the Amp 12.

Since the amplifier input switching signal has changed to the high level H, the input of the output voltage sensor 21 switches to GND and the output of the output voltage sensor 21 changes to the low level L. For example, in the variable voltage mode, the output voltage sensor 21 may not detect the output voltage of the envelope tracking power supply circuit 10 and even if the output voltage of the envelope tracking power supply circuit 10 exceeds the first value, the output voltage sensor 21 may not change its output.

As described above, the output of the output voltage sensor 21 has changed to the low level L. Therefore, in the reference voltage source 23, the charge and discharge circuit enters a charged state, the capacitance $C_{ref}$ is charged, the output of the comparator becomes the low level L, and the output of the reference voltage source 23 changes to the high level H. Thus, the envelope tracking power supply circuit 10 returns from the fixed voltage mode to the variable voltage mode.

The fixed/variable switching control circuit 13 and the switching circuit 14 illustrated in FIG. 11 may be included in the power supply circuit control circuit 2. Based on the output of the output voltage sensor 21 and the output of the reference voltage source 23, the standby signal generating circuit 24 in the fixed/variable switching control circuit 13 generates a standby signal indicating whether the Amp 12 is to operate. For example, the output of the Amp 12 may be input to the fixed/variable switching control circuit 13, and the standby signal generating circuit 24 may generate a standby signal by adding the output of the Amp 12 to the outputs of the output voltage sensor 21 and the reference voltage source 23.

The current source in the reference voltage source 23 illustrated in FIG. 12 may be replaced by a variable current source, or the capacitance $C_{ref}$ in the reference voltage source 23 may be replaced by a variable capacitance. Both the current source and the capacitance $C_{ref}$ may be variable. Timing adjustment for mode switching may be performed.

The output of the power supply circuit may switch between a fixed voltage and a variable voltage so that, for example, the capacitance and the switch in the power supply circuit illustrated in FIG. 4 may be removed. This may reduce the circuit size.

Figure 13:
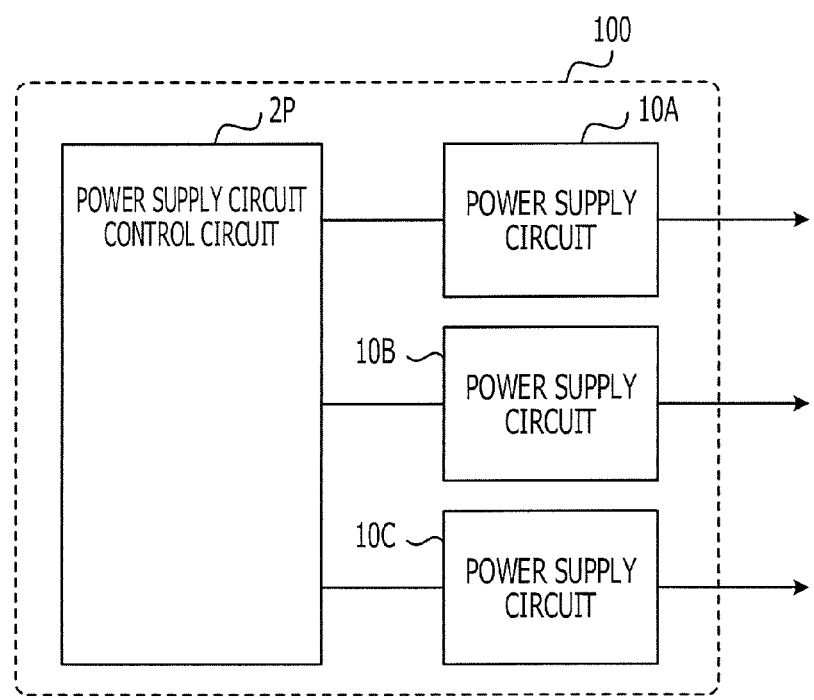
FIG. 13 illustrates an example of a power supply integrated circuit (IC)

FIG. 13 illustrates an example of a power supply integrated circuit (IC). As illustrated in FIG. 13, the power supply IC 100 includes a power supply circuit control circuit 2P and a plurality of power supply circuits, such as three power supply circuits 10A to 10C. The power supply circuits 10A to 10C may each be the envelope tracking power supply circuit 10 illustrated in FIG. 5 or 6. The power supply circuit control circuit 2P may have a function substantially the same as, or similar to, that of the power supply circuit control circuit 2 illustrated in FIG. 5 or 6, and may control a plurality of power supply circuits.

Figure 14:
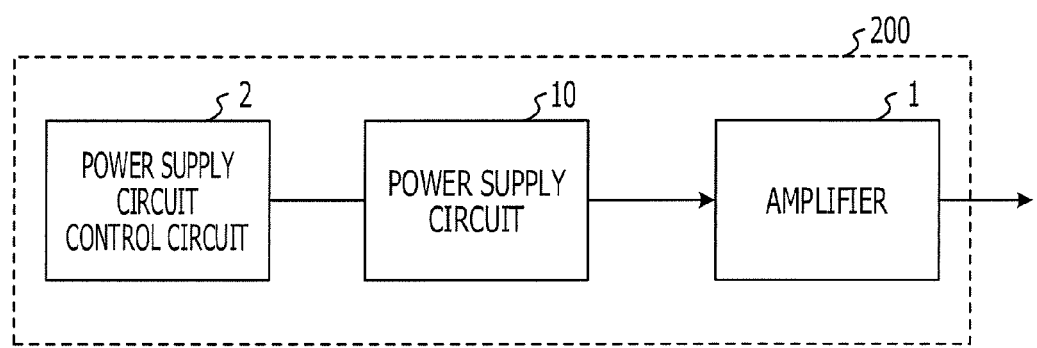
FIG. 14 illustrates an example of a power amplifying device.

FIG. 14 illustrates an example of a power amplifying device. FIG. 14 illustrates a configuration of a power amplifying device 200 that includes the power supply device illustrated in FIG. 5 or 6. The power amplifying device 200 includes the amplifier (power amplifier) 1, as well as the power supply circuit control circuit 2 and the envelope tracking power supply circuit 10 included in the power supply device illustrated in FIG. 5 or 6. Based on a variable voltage that follows an envelope supplied from the envelope tracking power supply circuit 10, the amplifier 1 amplifies and outputs a signal.

Figure 15:
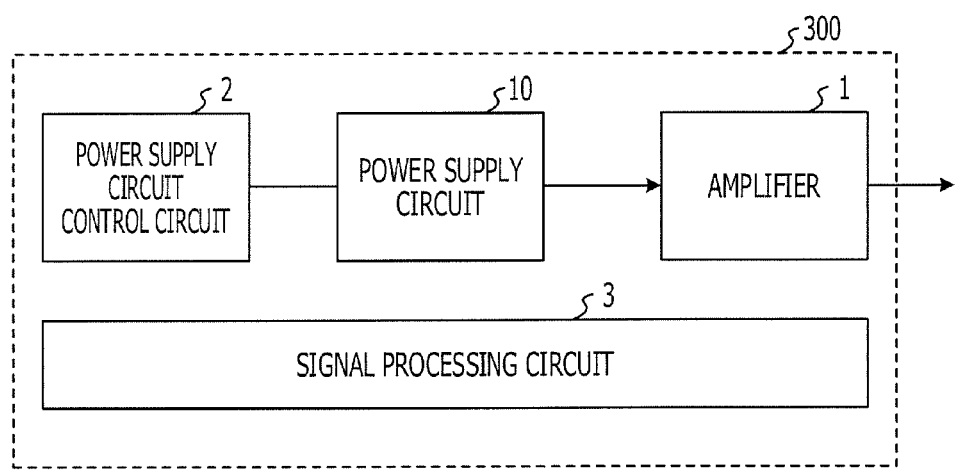
FIG. 15 illustrates an example of a radio communication apparatus.

FIG. 15 illustrates an example of a radio communication apparatus. FIG. 15 illustrates a configuration of a radio communication apparatus 300 that includes the power amplifying device illustrated in FIG. 14. The radio communication apparatus 300 includes a signal processing circuit 3 as well as the power amplifying device illustrated in FIG. 14. The signal processing circuit 3 performs signal processing related to radio communication and other signal processing, supplies the resulting signal to the power amplifier 1 and the power supply circuit control circuit 2, and transmits the signal from the power amplifier 1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power supply circuit comprising:
a direct current to direct current converter;
a linear amplifier; and
a first capacitance, one terminal of the first capacitance being coupled to an output of the linear amplifier, another terminal of the first capacitance being coupled to an output terminal and coupled to an output of the direct current to direct current converter via an inductor, wherein the linear amplifier is configured to operate in a variable voltage mode and to stop operating and couple the output of the linear amplifier to a ground in a fixed voltage mode.

2. The power supply circuit according to claim 1, further comprising a control circuit configured to control an operation mode of the linear amplifier in accordance with a mode switching signal indicating either the variable voltage mode or the fixed voltage mode.

3. The power supply circuit according to claim 2, further comprising a switch configured to switch an input of the linear amplifier, in accordance with an amplifier input switching signal, to an envelope signal in the variable voltage mode and to a voltage control signal output from the control circuit in the fixed voltage mode.

4. The power supply circuit according to claim 3, wherein the control circuit includes:
an output voltage sensor configured to detect an output voltage of the output terminal; and an amplifier input switching signal generating circuit configured to generate the amplifier input switching signal in accordance with the mode switching signal and an output voltage detection signal output from the output voltage sensor.

5. The power supply circuit according to claim 4, further comprising:
a reference voltage source configured to generate the voltage control signal in accordance with the output voltage detection signal; and
a standby signal generating circuit configured to generate a standby signal in accordance with the voltage control signal and the output voltage detection signal, the standby signal being used for switching an operating state of the linear amplifier.

6. The power supply circuit according to claim 4, wherein the reference voltage source includes a current source and a charge pump circuit including a second capacitance.

7. The power supply circuit according to claim 6, wherein the current source is a variable current source.

8. The power supply circuit according to claim 6, wherein the second capacitance is a variable capacitance.

9. The power supply circuit according to claim 2, wherein
the output of the linear amplifier is coupled to the control circuit; and
the amplifier input switching signal generating circuit generates the amplifier input switching signal in accordance with the mode switching signal, an output voltage detection signal output from the output voltage sensor, and the output of the linear amplifier.

10. A power supply system comprising:
a power supply circuit; and
a power supply circuit control circuit configured to output a mode switching signal to the power supply circuit,
wherein the power supply circuit comprises:
a direct current to direct current converter;
a linear amplifier; and
a first capacitance, one terminal of the first capacitance being coupled to an output of the linear amplifier, another terminal of the first capacitance being coupled to an output terminal and coupled to an output of the direct current to direct current converter via an inductor, wherein the linear amplifier configured to operate in a variable voltage mode and the linear amplifier configured to stop operating and couples an output of the linear amplifier to a ground in a fixed voltage mode.

11. The power supply system according to claim 10, further comprising:
an amplifier coupled to an output of the power supply circuit.

12. The power supply system according to claim 10, wherein the power supply circuit includes a control circuit configured to control an operation mode of the linear amplifier in accordance with the mode switching signal indicating either the variable voltage mode or the fixed voltage mode.

13. The power supply system according to claim 12, wherein the power supply circuit includes a switch configured to switch an input of the linear amplifier, in accordance with an amplifier input switching signal, to an envelope signal in the variable voltage mode and to a voltage control signal output from the control circuit in the fixed voltage mode.

14. The power supply system according to claim 13, wherein the control circuit includes:
an output voltage sensor configured to detect an output voltage of the output terminal; and
an amplifier input switching signal generating circuit configured to generate the amplifier input switching signal in accordance with the mode switching signal and an output voltage detection signal output from the output voltage sensor.

15. The power supply system according to claim 14, wherein the power supply circuit includes: a reference voltage source configured to generate the voltage control signal in accordance with the output voltage detection signal; and a standby signal generating circuit configured to generate a standby signal in accordance with the voltage control signal and the output voltage detection signal, the standby signal being used for switching an operating state of the linear amplifier.

16. A radio communication apparatus comprising:
a power supply circuit;
a power supply circuit control circuit configured to output a mode switching signal to the power supply circuit; and
an amplifier coupled to the power supply circuit, wherein the power supply circuit comprises:
a direct current to direct current converter;
a linear amplifier; and
a first capacitance, one terminal of the first capacitance being coupled to an output of the linear amplifier, another terminal of the first capacitance being coupled to an output terminal and coupled to an output of the direct current to direct current converter via an inductor, wherein the linear amplifier configured to operate in a variable voltage mode and the linear amplifier configured to stop operating and couples an output of the linear amplifier to a ground in a fixed voltage mode.

17. The radio communication apparatus according to claim 16, wherein the power supply circuit includes a control circuit configured to control an operation mode of the linear amplifier in accordance with the mode switching signal indicating either the variable voltage mode or the fixed voltage mode.

18. The radio communication apparatus according to claim 17, wherein the power supply circuit includes a switch configured to switch an input of the linear amplifier, in accordance with an amplifier input switching signal, to an envelope signal in the variable voltage mode and to a voltage control signal output from the control circuit in the fixed voltage mode.

19. The radio communication apparatus according to claim 18, wherein the control circuit includes: an output voltage sensor configured to detect an output voltage of the output terminal; and an amplifier input switching signal generating circuit configured to generate the amplifier input switching signal in accordance with the mode switching signal and an output voltage detection signal output from the output voltage sensor.

20. The radio communication apparatus according to claim 19, wherein the power supply circuit includes: a reference voltage source configured to generate the voltage control signal in accordance with the output voltage detection signal; and a standby signal generating circuit configured to generate a standby signal in accordance with the voltage control signal and the output voltage detection signal, the standby signal being used for switching an operating state of the linear amplifier.

* * * * *